[54] DERIVING SIGNAL CONSTRAINTS TO ACCELERATE SEQUENTIAL TEST GENERATION

[75] Inventors: Srimat T. Chakradhar, North Brunswick, N.J.; Vijay Gangaram, Elk Grove, Calif.; Steven G. Rothweiler, Kunkletown, Pa.

[73] Assignee: NEC USA, Inc., Princeton, N.J.

[21] Appl. No.: 837,138

[22] Filed: Apr. 14, 1997

[51] Int. Cl.$^6$ .................................................. G01R 31/28
[52] U.S. Cl. .......................... 371/22.1; 364/488; 364/489
[58] Field of Search ................................. 371/22.1, 27.1, 371/27.4; 364/488–490, 578, 581; 395/421.07; 326/765

[56] References Cited

U.S. PATENT DOCUMENTS

| | | | |
|---|---|---|---|
| 5,559,811 | 9/1996 | Abramovici et al. | 371/27 |
| 5,566,187 | 10/1996 | Abramovici et al. | 371/27 |
| 5,602,856 | 2/1997 | Teramoto | 371/27 |
| 5,625,630 | 4/1997 | Abramovici et al. | 371/27 |
| 5,657,240 | 8/1997 | Chakradhar et al. | 364/488 |
| 5,703,789 | 12/1997 | Beausang et al. | 364/489 |

OTHER PUBLICATIONS

Fujiwarea, Three valued Neural Networks for test generation, Fault tolerant computing, 1990 Int'l Symp, pp. 64–71.
Magdolen et al., REGGEN–Test generation on register transfer level, European design conference, pp. 259–264, 1993.
Roy et al., The use of RTL description on accurate timing verification and test generation, IEEE journal of solid–state, vol. 26, No. 9, pp. 1230–1239, 1991.
Chakradhar et al., Deriving signal constraints to accelerate sequential test generation, 10th Internal conference on VLSI design, pp. 499494, Jan. 1991.
Liang et al., "Identifying Untestable Faults in Sequential Circuits", IEEE Design & Test of Computers, Fall 1995.

*Primary Examiner*—Robert W. Beausoliel, Jr.
*Assistant Examiner*—Nadeem Iqbal
*Attorney, Agent, or Firm*—Sughrue, Mion, Zinn, Macpeak & Seas, PLLC

[57] ABSTRACT

A method to significantly accelerate sequential test generation algorithms by accurately computing signal constraints for large sequential circuits and using these constraints effectively during deterministic sequential test generation. The signal constraint computation technique is based on three key ideas: (1) unlike prior techniques (which compute line probabilities assuming only a 0 or 1 value for any signal), line probabilities are computed by allowing signals to assume values other than 0 or 1, (2) line justification techniques are employed to update line probabilities, and (3) symbolic simulation is iteratively used in conjunction with line probability computation and line justification to refine the set of values that a signal can assume. The method results in a significant reduction (more than 50%) in test generation time which is achieved without comprising the fault coverage than can be obtained.

13 Claims, 3 Drawing Sheets

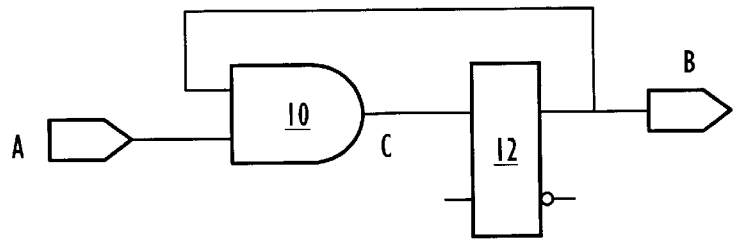
FIG. 1
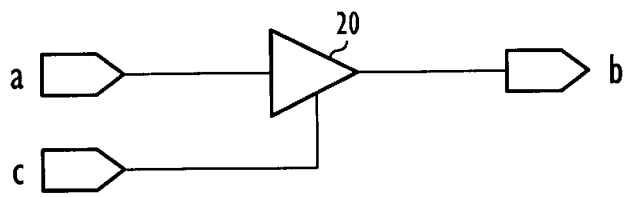
FIG. 2
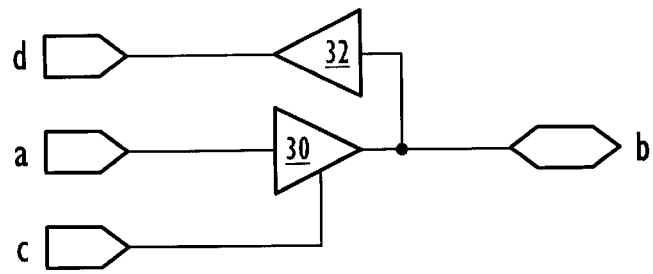
FIG. 3
| a | c | b |
|---|---|---|
| 0 | 1 | 0 |
| 1 | 1 | 1 |
| X | 0 | Z |
FIG. 4
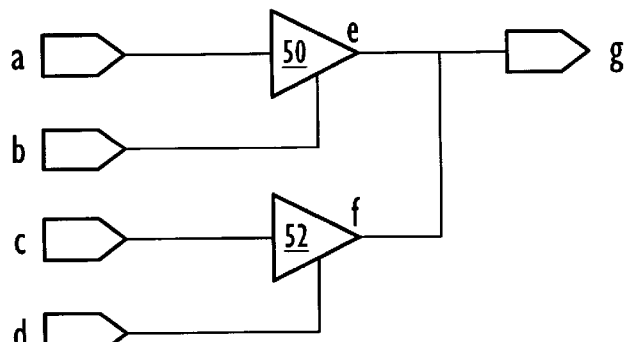
FIG. 5

DERIVING SIGNAL CONSTRAINTS TO ACCELERATE SEQUENTIAL TEST GENERATION

BACKGROUND OF THE INVENTION

1. Field of the Invention

The present invention relates generally to a method for deriving signal constraints to accelerate sequential test generation, and more particularly pertains to a method for accelerating sequential test generation algorithms for large sequential circuits by using signal constraints which provide information about sets of logic values that signals in the sequential circuit can or cannot assume for any input sequence. The method iteratively uses symbolic simulation in conjunction with 3-valued signal probabilities and line justification to refine the set of values that a signal can assume to efficiently compute the signal constraints.

2. Discussion of the Prior Art

Test generation for sequential circuits is significantly more difficult than combinational circuits due to the presence of memory elements. Hardware modifications like full scan design or partial scan design are being employed widely to alleviate the test generation problem. Design modifications render all or a subset of flip-flops to be completely controllable and observable. This implies that arbitrary logic values can be loaded into the scan flip-flops and circuit responses collected in any of the scan flip-flops can be observed. These modifications entail modest area and performance penalties but they can significantly increase the test application time and the size of the test set. Non-scan or partial scan designs may be more desirable because they incur fewer penalties than full-scan designs. However, these designs require a sequential test generator for deriving test sequences. The present invention speeds up sequential test generators without adversely affecting the fault coverages achievable using these tools.

SUMMARY OF THE INVENTION

Accordingly, it is a primary object of the present invention to provide a method for deriving signal constraints to accelerate sequential test generation.

A further object of the subject invention is the provision of a method for accelerating sequential test generation algorithms for large sequential circuits by using signal constraints which provide information about sets of logic values that signals in the sequential circuit can or cannot assume for any input sequence.

The derivation and use of signal constraints is utilized to accelerate deterministic sequential test generation. Signal constraints provide information about the set of logic values that signals in the sequential circuit can or cannot assume for any input sequence. Some signals may assume a value of 0 or 1 in every time frame. If a signal cannot assume a value 0(1) in any time frame, then the signal is assigned the symbol $\overline{O}(\overline{I})$. If it is impossible to justify a logic value of 0 or 1 on a signal, then assign the symbol U. Finally, if both 0 and 1 value on a signal can be justified, then assign the symbol G. These symbols are collectively referred to as the signal constraints. Several known techniques have been proposed to determine whether or not a signal in a sequential circuit can assume a specific logic value 0 or 1 in any time frame. A recently proposed technique uses symbolic simulation to determine whether or not a signal can be assigned the symbols of U, I or $\overline{O}$.

Sequential test generators can use the signal value information to (1) quickly identify untestable faults, (2) quickly identify conflicting value assignments to any signal, and (3) significantly reduce or prune the decision search space that has to be explored to find a test sequence for a given fault.

In accordance with the teachings herein, the present invention provides a method for accelerating sequential test generation algorithms for large sequential circuits. The method comprises using signal constraints which provide information about sets of logic values that signals in the sequential circuit can or cannot assume for any input sequence. In greater detail, the method iteratively uses symbolic simulation in conjunction with 3-valued signal probabilities and line justification to refine the set of values that a signal can assume to efficiently compute the signal constraints.

The method of the present invention allows signal probabilities to assume values other than only 0 or 1. Signal probabilities are computed by assuming that every signal can have three logic values, 0, 1 or an unknown value U, wherein the probability that a signal a assumes the logic value 0(1) or an unknown value U is denoted respectively as $P_0(a)$, $(P_1(a))$, and $P_U(a)$ Symbolic simulation is first used to identify signal constraints, signals which cannot assume the logic value 0 or 1 or both irrespective of the input sequence applied to the primary inputs, and signals that assume constant values 0 or 1. The signal constraints are considered in assigning initial and steady-state signal probabilities, which probabilities remain unchanged during a subsequent 3-valued signal probability computation. If a signal g assumes a constant value 1(0) for all input sequences, then permanently assign $P_1(g)=1$ ($P_0(g)=1$), and $P_0(g)=P_U(g)=0$ ($P_1(g)=P_U(g)=0$). If a signal g always assumes the symbol U, then permanently assign $P_U(g)=1$ and $P_0(g)=P_0(g)=P_1$ (g)=0. If a signal g cannot be initialized to the value 1(0), then-permanently assign $P_1(g)=P_U(g)=0$). These initial probabilities are updated during a subsequent probability computation.

Moreover, during the step of using symbolic simulation if a signal is the output of a flip-flop, then assign initial probabilities $P_0(g)=P_u(g)=0.5$ ($P_1(g)=P_U(g)=0.5$), and if no signal constraints are determined during symbolic simulation, then the flip-flop g is assigned the initial probabilities $P_0(g)=P_1(g)=0$ and $P_U(g)=1$.

During the subsequent probability computation updating step, the 3-valued signal probabilities are computed by the following steps;

i. for every primary input signal g, assign $P_o(g)=P_1(g)=$ 0.5, and $P_U(g)=0$, and for every flip-flop g in the circuit, assign $P_0(g)=P_1(g)=0$, and $P_U(g)=1$;

ii. compute output signal probabilities for all gates in the combinational logic, wherein combinational gates are processed in a levelized order wherein the output signal-probability of a gate is computed only after all its input probabilities are computed;

iii. transfer signal probabilities at the input of a flip-flop to its output if the difference between the input probability and the old output probability exceeds a pre-specified constant e; and iv. return to step ii if the output probability of any flip-flop has changed, otherwise computing signal probabilities is completed;

If the line probabilities are not candidates for line justification, the method is completed at this point.

If the line candidates are candidates for line justification, then line justification is employed to update line probabilities. Line justification determines whether or not a signal can assume a 0 or 1 value, and if a signal cannot be justified to a value 0(1) in any frame, then it is assigned the symbol $\overline{O}(\overline{I})$.

The computed 3-valued probabilities are used to select signal and value pairs for line justification, wherein a predetermined threshold probability value δ is used to determine candidate <signal,value> pairs. As few signal and value pairs as possible are selected for line justification.

Next line justification is attempted for each selected <signal,value> pair; and i. if the selected-signal cannot be justified to assume the given value, then a signal constraint is identified, and a new symbolic value is assigned to the signal. The newly assigned symbolic value can result in symbolic values for other signals, and therefore the symbolic values are updated by again performing incremental symbolic simulation; and ii. if the selected <signal,value> pair can be justified to assume the given value, then the low signal probability does not imply a signal constraint, the probability that the signal assumes the given value is permanently raised above the predetermined threshold, and this probability remains unchanged during the probability computation; and iii. wherein when line justification does not determine whether or not the <signal,value> pair is justifiable, then 1) either the selected <signal,value> pair is considered to be justifiable and the signal probability is raised, or 2) the selected <signal,value> pair is considered to be unjustifiable and a new symbolic value is assigned to the signal. The newly assigned symbolic value can result in symbolic values for other signals, and therefore the symbolic values are updated by again performing incremental symbolic simulation.

Moreover non-Boolean gates are allowed to assume an additional signal value.Z (high-impedance state), and therefore for a non-Boolean gate $o_1$ $P_0(o_1)+P_1(o_1)+P_Z(o_1)+P_U(o_1)=1$.

The identified signal constraints are then used during deterministic sequential test generation, wherein sequential test generators use the signal value information to quickly identify untestable faults, quickly identify conflicting value assignments to any signal, and significantly reduce the decision search space that has to be explored to find a test sequence for a given fault.

BRIEF DESCRIPTION OF THE DRAWINGS

The foregoing objects and advantages of the present invention for a method for deriving signal constraints to accelerate sequential test generation may be more readily understood by one skilled in the art with reference being had to the following detailed description of several preferred embodiments thereof, taken in conjunction with the accompanying drawings wherein like elements are designated by identical reference numerals throughout the several views, and in which:

FIG. 1 is an exemplary simple circuit to illustrate symbolic simulation;

FIG. 2 is a logic diagram of a tristate input/output buffer primitive;

FIG. 3 is a logic diagram of a bidirectional buffer primitive;

FIG. 4 illustrates a truth table for a tristate buffer as shown in FIG. 2;

FIG. 5 illustrates a logic diagram for a bus configuration;

DETAILED DESCRIPTION OF THE DRAWINGS

Figure 6:
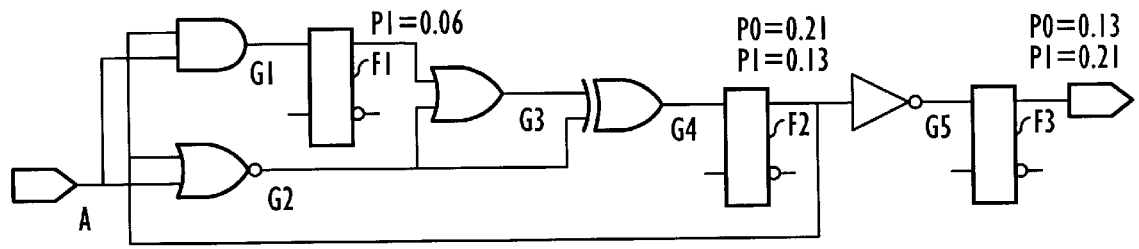
FIG. 6 illustrates an exemplary sequential circuit.

One method for computing signal constraints is to justify the values 0 or 1 on every signal in the circuit. If a signal cannot be justified to a value 0(1) in any time frame, then it is assigned the symbol $\overline{O}(I)$. The process called line justification determines whether or not a signal can assume the 0 or 1 value, and is frequently as hard as sequential test generation. For large circuits, this method of deriving signal constraints is prohibitively expensive and may require significantly more computational resources than sequential test generation.

Exact signal probabilities can also be used to compute signal constraints. Two signal probabilities can be computed for any signal in a combinational circuit: probability that the signal assumes the value 0 or 1 for a random input vector. Several methods have been proposed to compute exact signal probabilities, but they are applicable only to small or moderately sized circuits. The signal probability computation problem is also as hard as the test generation problem. Several methods are known for computing approximate signal probabilities for combinational circuits. However, accurate signal constraints cannot be obtained directly from approximate probabilities. Computing exact signal probabilities for large sequential circuits is impractical.

The present invention presents a new method for significantly accelerating sequential test generation algorithms by accurately computing signal constraints for large sequential circuits and using these constraints effectively during deterministic sequential test generation. The new signal constraint computation technique is based on three key features: (1) unlike prior techniques (which compute line probabilities assuming only a 0 or 1 logic value for any signal), line probabilities are computed by allowing signals to assume values other than only 0 or 1, (2) line justification techniques are employed to update line probabilities, and (3) symbolic simulation is iteratively used in conjunction with line probability computation and line justification to refine the set of values which a signal can assume. Experimental results on several large production and benchmark sequential circuits have shown that the technique results in a significant reduction (more than 50%) in the test generation time as compared to the base test generation system which does not use the new technique. The reduction in time is achieved without compromising the fault coverage that can be obtained by the base system. For several circuits, significantly higher fault coverages were obtained by incorporating the new technique in the base system.

The symbolic simulation method as disclosed by H. C. Liang, C. L. Lee, and J. E. Chen, "Identifying Untestable Faults in Sequential Circuits," IEEE Design and Test of Computers, no. 2, pp. 14–23, 1995, identifies signals in the circuit which cannot assume the logic value 0 or 1 or both, irrespective of the input sequence applied to the primary inputs. Symbolic simulation assumes that the initial state of all flip-flops is unknown (X). As an example, consider the simple circuit shown in FIG. 1. This circuit has an AND gate 10, a flip-flop 12, a primary input A, a primary output C, and a-flip-flop output B. Symbolic simulation begins by assuming an unknown initial value for the flip-flop 12. The primary input can assume either a 0 or 1 value. The AND gate 10 is analyzed to determine the possible set of values that signal C can assume. Signal C can be set to 0 by assigning a value of 0 to primary input A. However, the signal C cannot assume the value 1 because the flip-flop starts with an unknown initial value. Therefore, assign the symbol I to signal C. This completes one iteration of the symbolic simulation algorithm. The symbolic value at the input of the flip-flop is transferred to the output of the flip-flop. Therefore, signal B is now assigned the symbol I. Re-analyze the AND gate to determine the values signal C can assume. Since one of the inputs to the AND gate cannot assume the value 1, there is no change in the symbol assigned to signal C. Hence, the flip-flop is unchanged and the symbolic simulation process terminates. Rules to analyze other Boolean gates are also known in the art.

Symbolic simulation also attempts to identify signal constraints. However, the technique of the present invention for computing signal constraints differs qualitatively from symbolic simulation in two major ways: (1) unlike symbolic simulation which cannot identify signals that assume constant values 0 or 1, the technique of the present invention can discover constant signals, and (2) the technique of the present invention identifies significantly more signal constraints by iteratively using a combination of 3-valued line probabilities, line justification and symbolic simulation. The results demonstrated herein show that the signal constraints generated by the method of the present invention are valuable in accelerating sequential test generation algorithms beyond what is possible using constraints from only symbolic simulation.

3 Signal probability computation for 3-valued signals

Signal probabilities are computed by assuming that every signal can have only three logic values: 0, 1 or U. The probability that signal a assumes the logic value 0(1) is denoted as $P_0(a)$ ($P_1(a)$). Similarly, the probability that a signal assumes the unknown value U is denoted by $P_U(a)$. By definition, $P_0(a)+P_1(a)+P_U(a)=1$.

3.1 Boolean gates

Consider a gate with inputs $i_1, \ldots, i_n$ and output $o_1$. A signal probability value is derived for the output signal $o_1$ from the signal probabilities of the inputs, and it is assumed that input probabilities are independent. This implies not taking into account signal value correlation due to reconvergent paths. Hence, the signal probabilities which are computed are approximate.

3.1.1 AND gate

The output of an AND gate assumes the value 1 when all the inputs assume the value 1. Therefore, $P_1(o_1)=\Pi_{j=1}^{n} P_1(i_j)$. Note that $P_1(o_1)$ is computed assuming that the input probabilities are independent. Similarly, the output value is U only when (1) none of the inputs assume the value 0, and (2) not all inputs assume the value 1. Therefore, $P_U(o_1)=\Pi_{j=1}^{n} 1-P_0(i_j)) -P_1(o_1)$. Finally, the probability that signal $o_1$ assumes the value 0 is easily given by $P_0(o_1)=1 -P_1(o_1)-P_U(o_1)$. This is because the signal can assume only one of the three values, 0, 1 or U. Note that one has to first compute $P_1(o_1)$ before the other probabilities are computed for the output.

3.1.2 OR gate

The output of an OR gate assumes the value 0 when all inputs assume the value 0. Therefore, $P_{o(o1)}=\Pi_{j=1}^{n} P_0(i_j)$. Again, $P_0(o_1)$ is computed assuming that the input probabilities are independent. Similarly, the output value is U only when (1) none of the inputs assume the value 1, and (2) not all inputs assume the value 0. Therefore, $P_U(o_1)=\Pi_{j=1}^{n}(1-P_1(i_j))-P_o(0_1)$. Finally, the probability that signal $o_1$ assumes the value 1 is easily given by $P_0(o_1)=1-P_1(o_1)-P_U(o_1)$ Again, note one has to first compute $P_0(o_1)$ before the other output probabilities are computed.

3.1.3 Exclusive-OR gate

This is a complex gate and the output probabilities are derived a little differently. Consider a two-input XOR gate. The output value is 1 whenever the inputs assume different values. Therefore, $P_1(o_1)=P_0(i_1)P_1(i_2)+P_1(i_1)P_0(i_2)$. Similarly, the output value is 0 when both inputs are identical. Therefore, $P_0(o_1)=P_0(i_1)P_0(i_2)+P_1(i_1)P_1(i_2)$. Finally, the probability that the output assumes the value U is given by $P_U(o_1)=1-P_0(o_1)-P_1(o_1)$. For XOR gates with more than two inputs, the gate is considered as a cascade of two-input XOR gates. As an example, consider an XOR gate with three inputs $i_1$, $i_2$ and $i_3$ and output $o_1$. The cascade of two-input XOR gates is constructed as follows. Signals $i_1$ and $i_2$ are the inputs to the first XOR gate. The output of the first XOR gate and signal $i_3$ become the input signals to the second two-input XOR gate $o_1$. Note that the pairing of input signals can be done in different ways and this may yield different output signal probabilities. However, exact signal probability computation for an n-input gate will require examination of all $2^n$ input combinations.

3.2 Non-Boolean gates

Production circuits contain tri-state buffers, I/O or bidirectional buffers and bus configurations. The logic diagrams for tristate and bidirectional primitives are shown in FIGS. 2 and 3, respectively. The tri-state buffer 20 has two inputs, a and c, and one output signal b. Its truth table is shown in FIG. 4. Signals a and b assume identical values whenever the control signal c has the value 1. If c=0, then in the test generation model the value on signal a is considered irrelevant (indicated as X) because it does not affect the output signal b. Also, signal b will be in the high impedance state (indicated as Z). The bidirectional buffer consists of a tri-state buffer 30 and a non-inverting buffer 32. It has two input signals a and c, and two output signals b and c. Signal b is both an input and an output signal. The two output signals always have identical logic values. Whenever signal c=1, the output signals assume the value of signal a. However, when input c=0, the value on signal a is considered irrelevant and signal b assumes the high-impedance state. Thus, signal b can be driven to any logic value applied by an external source and signal d will assume the same value as that of b.

The logic diagram for a bus configuration is shown in FIG. 5. Here, two tristate buffers 50,52 are driving the bus g. In general, several tristate buffers can drive the same bus. If all tristate buffers are in the high-impedance state, then the bus assumes the high-impedance state. If any two tristate buffers try to drive the bus to different Boolean logic values (0 and 1), then the value on the bus is undefined (U). Otherwise, one or more tristate buffers drive the bus to a unique Boolean value while others remain in the high-impedance state.

The present invention allows non-Boolean gates to assume an additional signal value Z (high-impedance state). Therefore, for a non-Boolean gate $o_1$, $P_0(o_1)+P_1(o_1)+P_Z(o_1)+P_U(o_1)=1$.

3.2.1 Tri-state buffer

The output probabilities of a tristate gate are derived as follows. Consider the tristate gate shown in FIG. 2. The output value of the gate is 1 only when both data (a) and control (c) inputs assume the value 1. Therefore, $P_1(b)=P_1(a)P_1(c)$. Again, assume that the signals a and c are independent. The output value of the gate is 0 only when data (a) input is 0 and the control (c) input assumes the value 1. Therefore, $P_0(b)=P_0(a)P_1(c)$. When the control input c is 0, then the tristate gate assumes the high-impedance state Z. Therefore, $P_z(b)=P_0(c)$. The probability that the tristate gate assumes the unknown state is given by $P_U(b)=1-P_0(b)-P_1(b)-P_z(b)$.

3.2.2 Bus

Consider the bus configuration shown in FIG. 5. Gates e and f drive the bus g. The output g assumes the value 0 only when (1) gate e assumes the value 0 and gate f is in high-impedance state, or (2) gate f assumes the value 0 and gate e is in high-impedance state, or (3) both gates e and f assume the value 0. Therefore, $P_0(g)=P_0(e)P_Z(f)+P_Z(e)P_0(f)+P_0(e)P_0(f)$. Similarly, the probability that the bus assumes the value 1 is given by $P_1(g)=P_1(e)P_Z(f)+P_Z(e)P_1(f)+P_1(e)P_1(f)$. The probability that the bus assumes the unknown value is $P_U(g)=1-P_0(g)-P_1(g)$. If the bus is driven by more than two signals, then the output probabilities are computed by considering the bus as a cascade of two-input bus configurations. This approximation is similar to the case of the XOR gate with more than two inputs.

3.3 Probability computation algorithm

The procedure for computing the 3-valued signal probabilities consists of the following steps:

1. Assign $P_0(g)=P_1(g)=0.5$, and $P_U(g)=0$ for every primary input signal g. Assign $P_0(g)=P_1(g)=0$, and $P_U(g)=1$ for every flip-flop g in the circuit.
2. Compute signal probabilities for all gates in the combinational logic using the rules described in Sections 3.1 and 3.2. The combinational gates are processed in a levelized order so that the probability of a gate is computed only after all its input probabilities are computed.
3. Transfer signal probabilities at input of a flip-flop to its output if the difference between the input probability and the old output probability exceeds a prespecified constant $\epsilon$.
4. Go to Step 2 if the output probability of any flip-flop has changed. Otherwise, computing signal probabilities is finished.

3.4 Example

As an example, consider the circuit shown in FIG. 6. This circuit has three flip-flops F1, F2, and F3. Begin by assigning initial probabilities to the primary input and the flip-flops. Primary input A is assigned the following probabilities: $P_0(A)=P_1(A)=0.5$ and $P_U(A)=0$. For the flip-flops, assign $P_U(F1)=P_U(F2)=P_U(F3)=1$. All other probabilities for the flip-flops are zero. If one chooses $\epsilon=0.001$, then the steady-state signal probabilities given in Table 1 are obtained.

TABLE 1

3-valued signal probabilities for example circuit

| Signal | $P_0$ | $P_1$ | $P_U$ |
|---|---|---|---|
| A  | 0.50 | 0.50 | 0.00 |
| G1 | 0.60 | 0.06 | 0.33 |
| G2 | 0.56 | 0.10 | 0.33 |
| G3 | 0.34 | 0.16 | 0.50 |
| G4 | 0.21 | 0.13 | 0.67 |
| G5 | 0.13 | 0.21 | 0.67 |
| F1 | 0.60 | 0.06 | 0.33 |
| F2 | 0.21 | 0.13 | 0.67 |
| F3 | 0.13 | 0.21 | 0.67 |

4 Signal constraint computation

Figure 7:
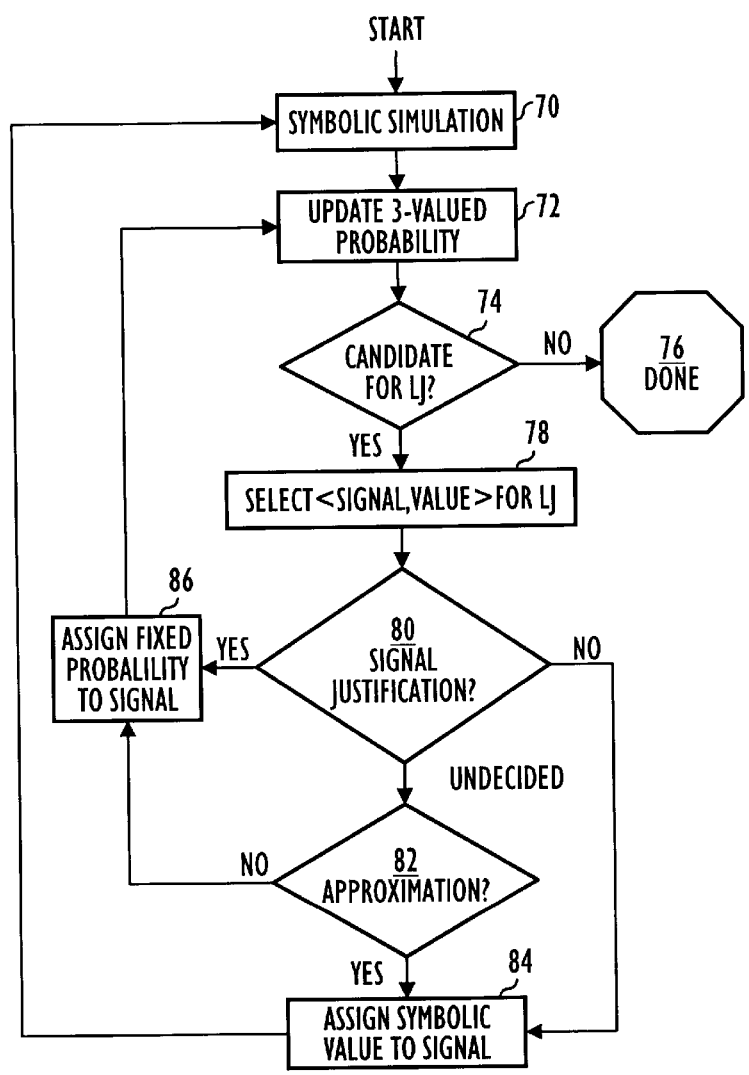
FIG. 7 illustrates an algorithm pursuant to the present invention which is used to compute signal constraints.

The present invention uses a combination of symbolic simulation, 3-valued signal probabilities, and line justification techniques to efficiently compute signal constraints. FIG. 7 shows the algorithm used to compute signal constraints. The goal of this algorithm is to quickly determine signal constraints in large sequential circuits.

4.1 Algorithm

The algorithm begins at 70 by performing symbolic simulation using known techniques. Symbolic simulation can result in signal constraints for several signals. These constraints are considered in assigning initial and steady-state probabilities. For example, if a signal g assumes a constant value 1(0) for all input sequences, then permanently assign $P_1(g)=1(P_0(g)=1$ and $P_0(g)=P_U(g)=0(P_1(g)=P_U(g)=0)$. These probabilities remain unchanged during the 3-valued signal probability computation. Similarly, if symbolic simulation determines that signal g always assumes the symbol U, then permanently assign $P_U(g)=1$ and $P_0(g)=P_1(g)=0$.

If a signal g cannot be initialized to the value 1(0), then permanently assign $P_1(g)=0(P_0(g)=0)$. If the signal is a flip-flop, then also assign initial probabilities $P_0(g)=P_U(g)=0.5(P_1(g)=P_U(g)=0.5)$. Note that if no signal constraints were determined during symbolic simulation, then the flip-flop g is assigned the initial probabilities $P_0(g)=P_1(g)=0$ and $P_U(g)=1$. Initial probabilities may be updated during the probability computation phase.

The algorithm computes 3-valued probabilities at 72 as described in Section 3. These probabilities are used to select signal and value pairs at steps 74 and 78 for which line justification will be attempted. A predetermined threshold probability value δ is used to determine candidate <signal, value> pairs. For example, if $P_0(g)<\delta(P_1(g)<\delta)$, then we consider line justification of signal g to the value 0(1). Since line justification is computationally expensive, it is desirable to select as few candidate <signal,value> pairs as possible. Note that if the threshold probability δ is high, then there will be too many candidates for line justification. Also, if the threshold is very low, then there may be none or very few candidates for line justification, If this happens, then no new signal constraints may be determined beyond the symbolic simulation phase.

Line justification is attempted at step 80 for the selected <signal,value> pair at step 78. Three outcomes are possible. If the signal cannot be justified to assume the given value (step 80-No), then we have a signal constraint. We assign appropriate symbolic value to the signal at step 84. For example, if line justification determines that signal g cannot assume the value 0 for any input sequence, then assign $\overline{O}$ to the signal g. The newly assigned symbolic value can result in symbolic values for other signals. Therefore, update the symbolic values by again performing (incremental) symbolic simulation by returning to step 70.

If the <signal,value> pair can be justified (step 80-Yes) then the low signal probability does not imply a signal constraint. The probability that the signal assumes the given value is permanently raised at step 86 above the predetermined threshold. This probability remains unchanged during the probability computation phase. Intuitively, there are two reasons for raising the probability: (1) the <signal,value> pair will not be considered again for line justification, and (2) the justification of the target <signal,value> pair can imply the successful justification of other candidate <signal, value> pairs. The increased probability can lead to an increase (above the predetermined threshold δ) in signal probabilities of current candidate signals. These candidate signals do not have to be considered for line justification. Note that raising the probability will make the sum of the 0, 1 and U probabilities to exceed 1. First decrease the U probability by as much as possible without going below zero. If the sum of probabilities still exceeds 1, then suitably decrease the 1(0) probability to compensate for the increase in the 0(1) probability.

Line justification can exhaust the available computational resources and we cannot determine (step 80-Undecided) whether or not the signal <signal,value> pair is justifiable. One possibility is to consider that the <signal,value> pair may be justifiable and raise the signal probabilities. The other option is to assume that the <signal,value> pair is probably unjustifiable and proceed to assign a (possibly incorrect) symbolic value to the signal. It has been found that using this approximation results in an acceleration of the test generator without adversely compromising on the attainable fault coverage. Section 5 reports on experimental results obtained using this option.

TABLE 2

Probabilities after setting $P_0(F2) = 0.5$.

| Signal | $P_O$ | $P_1$ | $P_U$ |
|--------|-------|-------|-------|
| A  | 0.50 | 0.50 | 0.00 |
| G1 | 0.75 | 0.06 | 0.19 |
| G2 | 0.56 | 0.25 | 0.19 |
| G3 | 0.42 | 0.30 | 0.28 |
| G4 | 0.31 | 0.27 | 0.42 |
| G5 | 0.13 | 0.50 | 0.37 |
| F1 | 0.75 | 0.06 | 0.19 |
| F2 | 0.50 | 0.13 | 0.37 |
| F3 | 0.13 | 0.50 | 0.37 |

4.2 Example

Figure 8:
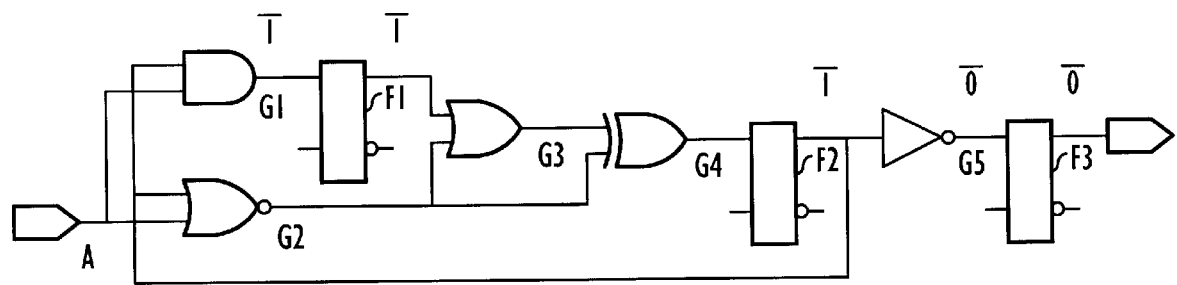
FIG. 8 illustrates the final signal constraints for all signals in the exemplary circuit of FIG. 6.

Consider again the circuit shown in FIG. 6. One can easily verify that symbolic simulation does not result in any signal constraints. The 3-valued signal probabilities for this circuit are shown in Table 1. If we consider a threshold of $\delta=0.25$ and consider only flip-flops, then there are five candidates for line justification: <F1,1>, <F2,0>, <F2,1>, <F3,0> and <F3,1>. These candidates are also shown in FIG. 6. If we consider the candidate <F2,0> for line justification, we see that the signal is justifiable. Therefore, we raise the probability $P_0(F1)$ beyond the threshold $\delta$ and assign the value 0.5. We recompute signal probabilities before picking the next candidate for line justification. If we do not recompute probabilities, then we will unnecessarily attempt line justification for the candidate pair <F3,1> and find that this signal is also justifiable. The updated signal probabilities are shown in Table 2. Let the next candidate for line justification be <F2,1> (the other candidates are <F1,1> and <F3,0>). It is easy to verify that signal F2 cannot be justified to the value 1. Therefore, immediately assign the symbolic value I and proceed with symbolic simulation. Signals F1 and F3 now assume the symbolic values $\bar{I}$ and $\bar{O}$, respectively. Signal probabilities $P_1(F1)$ and $P_0(F2)$ are updated and assigned the value 0. Subsequent (incremental) 3-valued probability computation results in the probabilities shown in Table 3. There are no more candidate signals for line justification. This completes the derivation of signal constraints. FIG. 8 shows the final signal constraints for all signals.

TABLE 3

Probabilities after setting $P_1(F2) = 0.0$.

| Signal | $P_O$ | $P_1$ | $P_U$ |
|--------|-------|-------|-------|
| A  | 0.50 | 0.50 | 0.00 |
| G1 | 0.75 | 0.00 | 0.25 |
| G2 | 0.50 | 0.25 | 0.25 |
| G3 | 0.38 | 0.25 | 0.38 |
| G4 | 0.25 | 0.22 | 0.53 |

4.3 Use of signal constraints during test generation

Signal constraints can be used by a test generator in several ways. Identification of untestable faults during test generation requires significant computing resources. Signal constraints can identify many untestable faults without search. For example, consider again the example circuit of FIG. 8. Signals G1, F1, and F2 are assigned the symbols I. Stuck-at 0 faults on these lines cannot be activated and these faults are untestable. Note that we are assuming a single observation time strategy for test generation. Similarly, stuck-at 1 faults on signals G5 and F3 are also untestable. If signal constraints were not available to the test generator, then these faults will have to be considered by the tset generator and shown to be untestable.

Signal constraints can also be used to quickly determine conflicting signal assignments. For example, signal G1 in FIG. 8 cannot assume the value 1 for any input sequence. If we consider a time-frame expansion based sequential test generator, then signal G1 may be assigned the value 1. This is because the test generator works on one or a finite number of time frames and it may be unaware of the fact that signal G1 cannot be justified to the value 1. In contrast, signal constraints are derived using global information about the entire sequential circuit. Gate implication functions (simulation and justification rules) in sequential test generators can also be augmented to manipulate the symbols $\bar{O}$ and I. This will result in dynamic generation of signal constraints during the test generation process.

TABLE 4

Characterstics of prodcution VLSI circuits

| Circuit | Gates | Tristates | Buses | I/O Buffers | Flip-Flops S/R | Flip-Flops D-type |
|---------|-------|-----------|-------|-------------|-----|--------|
| d1 | 22866 | 367  | 367  | 0  | 801 | 0   |
| d2 | 23693 | 23   | 91   | 34 | 527 | 0   |
| d3 | 79731 | 1406 | 1428 | 11 | 708 | 231 |
| d4 | 19323 | 365  | 365  | 0  | 721 | 0   |

Signal constraints can significantly reduce the search space that has to be explored to find a test sequence. For example, if a signal constraint is I, then the branch and bound search phase does not have to consider trying the value 1 for this signal. If the circuit has many signal constraints, then a significant portion of the search space does not have to be explored. Experimental results in Section 5 show that use of signal constraints during deterministic test generation significantly improves the performance of the test generator.

5 Experimental results

The signal constraint computation technique described in Section 4.1 has been incorporated into an in-house sequential circuit test generator. The performance of this test generator is comparable to a commercially available tool. Our test generator employs both forward and backward time processing to generate test sequences. The base test generator already uses symbolic simulation to compute some of the signal constraints. We report experimental results on several production and benchmark sequential circuits. We have used a threshold probability value of 10e−16 for candidate selection and probabilities of justified signal values are set to a constant value 0.00001. The same constants are used in all of the experiments. All experiments were performed on a SUN SPARC5 workstation. Table 4 shows the characteristic of the production circuits used in the experiments. These circuits have several non-Boolean primitives like tristate buffers, bidirectional (I/O) buffers and buses. In addition, they have set/reset flip-flops and multiple clocks. For example, circuit d3 has 79731 gates. There are 1406 tristate buffers, 1428 buses and 11 bidirectional (I/O) buffers. This circuit has a mix-of 708 set/reset flip-flops and 231 D-type flip-flops.

Tables 5 and 6 show test generation results for several production and benchmark sequential circuits. The name of the circuit is given in column Circuit and the specific method used to process the circuit is indicated in column Method. We considered two cases for every circuit. Results obtained using the base sequential test generator are reported in rows labeled as base. We refer to the base test generator that includes our signal constraint computation technique as the new test generator. Results obtained by the new test generator are shown in rows labeled as new. Statistics for the proposed signal constraint computation technique are shown in column FSC. If line justification for a signal is undecided, we used the approximation that marks the signal as unjustifiable. Results for the case when the approximation is not used are not included. However, we observed that by using the approximation it is possible to get a slightly better acceleration. The number of flip-flops that are assigned the symbols $\bar{1}$ or $\bar{0}$ are shown in column FSC-Uninit FFs. The CPU seconds required for signal constraint computation are shown in column FSC - CPU sec. Test generation statistics are shown in column ATG. We report the fault coverage (Fault Cov), fault efficiency (Fault Eff), and total CPU seconds (CPU sec) required by the test generator. Column CPU sec includes the time shown in FSC - CPU sec. Column Speedup reports the acceleration obtained by the new test generator as compared to the base test generation tool.

TABLE 5

Results for production VLSI circuits

| | | FSC | | | ATG | | | Speedup |
|---|---|---|---|---|---|---|---|---|
| | | Uninit FFs | | CPU | Fault | Fault | | (base/ |
| Circuit | Method | 0 | 1 | sec | Cov | Eff | CPU sec | new) |
| d1 | base | 0 | 0 | 0.1 | 89.99 | 94.12 | 26640.7 | |
| | new | 0 | 27 | 638.6 | 91.04 | 96.93 | 15138.8 | 1.8 |
| d2 | base | 0 | 0 | 0.1 | 94.79 | 96.49 | 23230.3 | |
| | new | 0 | 9 | 115.2 | 95.62 | 97.68 | 17234.8 | 1.4 |
| d3 | base | 0 | 115 | 0.3 | 89.44 | 95.01 | 123270.7 | |
| | new | 0 | 160 | 803.0 | 89.38 | 96.82 | 90347.7 | 1.4 |
| d4 | base | 0 | 0 | 0.1 | 90.06 | 93.76 | 25629.4 | |
| | new | 0 | 25 | 527.9 | 90.06 | 95.18 | 11565.7 | 1.4 |

As an example, consider circuit d1 in Table 5. The base test generator uses the symbolic simulation technique and 0.1 seconds were required to complete symbolic simulation. Also, symbolic simulation did not result in any signal constraints. The base test generator obtained a fault coverage of 89.99% and achieved a fault efficiency of 94.12%. The base test generator required a total of 26640.7 CPU seconds. In the new test generator, our new signal constraint computation technique required 638.6 CPU seconds and we found 27 flip-flops that can not be initialized to the value 1. The new test generator also obtained a higher fault coverage (91.04%) and fault efficiency (96.93%) using only 15138.8 CPU seconds. This time includes the CPU seconds required for our constraint computation. Therefore, the new test generator is about 1.8 times faster than the base test generator.

Table 6 shows the test generation results for the ISCAS 89 sequential benchmark circuits. Test generation data for the larger circuits (s35932, s38417 and s38584) are not yet available. However, we do show the CPU seconds required by our signal constraint computation technique.

Results in Tables 5 and 6 show that our signal constraint computation techniques is practical for large circuits. Our constraint computation technique requires more CPU seconds than the symbolic simulation technique but our method finds significantly more signal constraints. Also, the signal constraint computation time is a small fraction of the total test generation time. Overall, our technique can accelerate the base test generator by a factor of 1.4 to 3.0 for the example circuits we have considered. For several circuits, the improvement in CPU seconds was accompanied by a significant improvement in fault coverage (for example, experiments on the circuit s400 show an increase in fault coverage from 12.57% to 41.88% with significant reduction in test generation time).

Note that there is an increase in CPU time for the circuit s15850. The constraints found by symbolic simulation are sufficient to achieve the target efficiency on this circuit. Therefore the time spent in our signal constraint computation is simply an overhead. Also note that there is a normal drop in fault coverage for circuits d3 and s15850. This can be explained as follows. For all example circuits, we did verify that all faults targeted and detected by the base test generator were also targeted and detected by the augmented test generator. However, faults that are fortuitously detected during fault simulation could differ. Unspecified bits in the test sequence are randomly filled by our test generator before the sequence is considered for fault simulation. Therefore, it is possible that the random specification of bits can result in a difference between the fortuitously detected faults during fault simulation phase of the base and the augmented test generator. This effect was observed in only two of the example circuits we considered.

TABLE 6

Results for ISCAS 89 sequential benchmark circuits

| | | FSC | | | ATG | | | |
|---|---|---|---|---|---|---|---|---|
| | | Uninit FFs | | CPU | Fault | Fault | | Speedup |
| Circuit | Method | 0 | 1 | sec | Cov | Eff | CPU sec | (base/new) |
| s208 | base | 0 | 0 | 0.1 | 62.31 | 96.98 | 6.0 | |
| | new | 0 | 3 | 0.1 | 62.31 | 97.49 | 3.7 | 1.6 |
| s382 | base | 0 | 0 | 0.1 | 18.77 | 20.73 | 5183.1 | |
| | new | 4 | 5 | 161.6 | 42.86 | 76.75 | 1944.7 | 2.7 |
| s400 | base | 0 | 0 | 0.1 | 12.57 | 15.71 | 5809.7 | |
| | new | 4 | 5 | 161.8 | 41.88 | 76.70 | 2003.0 | 2.9 |
| s420 | base | 0 | 0 | 0.1 | 39.20 | 91.46 | 30.0 | |
| | new | 0 | 11 | 0.2 | 39.45 | 94.22 | 12.1 | 2.5 |

TABLE 6-continued

Results for ISCAS 89 sequential benchmark circuits

| | | FSC | | | ATG | | | |
|---|---|---|---|---|---|---|---|---|
| | | Uninit FFs | | CPU | Fault | Fault | | Speedup |
| Circuit | Method | 0 | 1 | sec | Cov | Eff | CPU sec | (base/new) |
| s444 | base | 0 | 0 | 0.1 | 10.19 | 13.66 | 6504.6 | |
| | new | 1 | 4 | 68.4 | 14.12 | 45.14 | 4498.2 | 1.5 |
| s526 | base | 0 | 0 | 0.1 | 7.60 | 12.48 | 8903.0 | |
| | new | 2 | 7 | 162.0 | 15.20 | 16.73 | 4840.4 | 1.8 |
| s838 | base | 0 | 0 | 0.1 | 27.24 | 88.02 | 171.8 | |
| | new | 0 | 27 | 0.3 | 27.24 | 93.06 | 57.2 | 3.0 |
| s1423 | base | 0 | 0 | 0.1 | 20.04 | 20.92 | 17321.1 | |
| | new | 0 | 3 | 41.7 | 20.04 | 23.85 | 16203.0 | 1.1 |
| s5378 | base | 1 | 1 | 0.1 | 60.26 | 73.73 | 8809.4 | |
| | new | 14 | 24 | 112.4 | 70.62 | 89.68 | 4339.3 | 2.0 |
| s13207 | base | 460 | 456 | 0.1 | 5.91 | 93.75 | 11372.5 | |
| | new | 463 | 470 | 184.0 | 5.91 | 97.35 | 5949.1 | 1.9 |
| s15850 | base | 292 | 365 | 0.2 | 0.69 | 99.95 | 883.5 | |
| | new | 292 | 390 | 276.9 | 0.69 | 99.95 | 1143.5 | 0.8 |
| s35932 | base | 0 | 0 | 0.5 | | | | |
| | new | 0 | 0 | 39.0 | | | | |
| s38417 | base | 0 | 0 | 0.6 | | | | |
| | new | 302 | 262 | 6175.2 | | | | |
| s38584 | base | 47 | 103 | 0.5 | | | | |
| | new | 47 | 127 | 1426.2 | | | | |

6 Conclusion

A new method has been presented to derive and use signal constraints to significantly accelerate the test generation process for large sequential circuits. Experimental results on several circuits (including production and benchmarks) unequivocally show that signal constraints can significantly improve the performance of a sequential test generator. The specific method of deriving signal constraints is applicable to large sequential circuits. The improvement in performance of the sequential test generator is adequate testimony to the quality of the signal constraints. It is believed that signal constraints can also be used to significantly improve the performance of test generators for fault models other than the stuck-at model, and for accelerating timing analysis and logic synthesis tools.

While several embodiments and variations of the present invention for deriving signal constraints to accelerate sequential test generation are described in detail herein, it should be apparent that the disclosure and teachings of the present invention will suggest many alternative designs to those skilled in the art.

What is claimed is:

1. A method for accelerating sequential test generation algorithms for large sequential circuits comprising:
    a) using signal constraints which provide information about sets of logic values that signals in the sequential circuit can or cannot assume for any input sequence; and
    b) iteratively using symbolic simulation in conjunction with 3-valued signal probabilities and line justification to refine the sets of logic values that a signal can assume to efficiently compute the signal constraints.
2. A method as claimed in claim 1, further comprising:
    c) allowing signal probabilities to assume values other than one of 0 and 1; and;
    d) computing signal probabilities by assuming that every signal can have one of three logic values, wherein said three logic values are 0, 1 and an unknown value U, wherein the probability that a signal a assumes the logic value 0, 1 or an unknown value U is denoted respectively as $P_0(a)$, $(P_1(a))$, and $P_u(a)$.
3. A method as claimed in claim 2, further comprising:
    e) using symbolic simulation to identify signal constraints, wherein said signal constraints are signals which cannot assume one of logic value of 0, 1 and both irrespective of input sequence applied to primary inputs, and signals that assume constant values of one of 0 and 1;
    f) considering the signal constraints in assigning initial and steady-state signal probabilities, said probabilities remaining unchanged during a 3-valued signal probability computation, wherein if a signal g assumes a constant value of one of 0 and 1 for all input sequences, then permanently assigning $P_u(g)=P_1(g)=0$, and if a signal g cannot be initialized to one of 0 and 1, then permanently assigning $P_1(g)=0$ ($P_0(g)=0$);
    g) updating initial probabilities during the signal probability computation.
4. A method as claimed in claim 3, wherein during the step of using symbolic simulation, if a signal is an output of a flip-flop, then assigning initial probabilities $P_0(g)=P_u(g)=0.5$ ($P_1(g)=P_u(g)=0.5$), and if no signal constraints are determined during symbolic simulation, then assigning to the flip-flop q initial probabilities $P_0(g)=P_1(g)=0$ and $P_u(g)=1$.
5. A method as claimed in claim 2, further comprising:
    h) computing 3-valued signal probabilities by a method comprising:
    i) for every primary input signal g, assigning $P_0(g)=P_1(g)=0.5$, and $P_u(g)=0$, and for every flip-flop g in the circuit, assigning $P_0(g)=P_1(g)=0$, and $P_u(g)=1$;
    ii) computing output signal probabilities for all gates in combinational logic, wherein combinational gates are processed in a levelized order wherein output signal probability of a gate is computed only after all input probabilities of said gate are computed;
    iii) transferring signal probabilities at input of a flip-flop to output of said flip-flop if difference between input probability and old output probability exceeds a pre-specified constant $\epsilon$; and iv) returning to step ii if output probability of any flip-flop has changed, otherwise completing computation of signal probabilities.

6. A method as claimed in claim 4, wherein if the line probabilities are not candidates for line justification, the method is completed.

7. A method as claimed in claim 4, further comprising:

i) if line probabilities are candidates for line justification, then employing line justification to update line probabilities, wherein line justification determines whether or not a signal can assume one of 0 and 1 value, and if a signal cannot be justified to a value of one of 0 and 1 in any frame, then assigning the symbol $\overline{0}$ and $\overline{1}$ respectively;

j) using computed 3-valued probabilities to select signal and value pairs for line justification, wherein a predetermined threshold probability value δ is used to determined candidate <signal,value> pairs; and k) attempting line justification for each selected <signal, value> pair.

8. A method as claimed in claim 3, wherein as few signal and value pairs as possible are selected for line justification.

9. A method as claimed in claim 7, wherein if the selected signal cannot be justified to assume a given value, then a signal constraint is identified, and a new symbolic value is assigned to the signal, said new symbolic value can result in symbolic values for other signals, and therefore the symbolic values are updated by again performing incremental symbolic simulation.

10. A method as claimed in claim 7, wherein if the selected <signal,value> pair can be justified to assume the given value, then the low signal probability does not imply a signal constraint, the probability that the signal assumes the given value is permanently raised above the predetermined threshold, and this probability remains unchanged during the probability computation.

11. A method as claimed in claim 7, wherein when line justification does not determine whether or not the <signal, value> pair is justifiable, then either the selected <signal, value> pair is considered to be justifiable and the signal probability is raised, or the selected <signal,value> pair is considered to be unjustifiable and a new symbolic value is assigned to the signal said new symbolic value can result in symbolic values for other signals, and therefore the symbolic values are updated by again performing incremental symbolic simulation.

12. A method as claimed in claim 1, further comprising using the identified signal constraints during deterministic sequential test generation, wherein sequential test generators use the signal value information to quickly identify untestable faults, quickly identify conflicting value assignments to any signal, and significantly reduce the decision search space that has to be explored to find a test sequence for a given fault.

13. A method as claimed in claim 1, wherein non-Boolean gates are allowed to assume an additional signal value Z for a high-impedance state, and therefore for a non-Boolean gate g $P_0(o_g)+P_1(o_g)+P_z(o_g)+P_U(o_g)=1$.

* * * * *

UNITED STATES PATENT AND TRADEMARK OFFICE
CERTIFICATE OF CORRECTION

PATENT NO. : 5,875,196
DATED : February 23, 1999
INVENTOR(S) : Srimat T. CHAKRADHAR, Vijay GANGARAM and Steven G. ROTHWEILER It is certified that error appears in the above-indentified patent and that said Letters Patent is hereby corrected as shown below:

On the title page:

After "[22]" and before "[51]", insert --Related U.S. Application Data [60] Provisional Application No. 60/034,811 dated 01/03/97--.

Signed and Sealed this

Ninth Day of November, 1999

Attest:

Q. TODD DICKINSON

*Attesting Officer*   *Acting Commissioner of Patents and Trademarks*